(12) United States Patent
Shim et al.

(10) Patent No.: US 8,148,765 B2
(45) Date of Patent: Apr. 3, 2012

(54) RESISTIVE RANDOM ACCESS MEMORY

(75) Inventors: Hyun-Jun Shim, Hwseong-si (KR); Han-Sin Lee, Yongin-si (KR); In-Gyu Baek, Seoul (KR); Jinshi Zhao, Hwaseong-si (KR); Eun-Kyung Yim, Seoul (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 143 days.

(21) Appl. No.: 12/649,413

(22) Filed: Dec. 30, 2009

(65) Prior Publication Data

US 2010/0163823 A1    Jul. 1, 2010

(30) Foreign Application Priority Data

Dec. 30, 2008 (KR) .................. 10-2008-0136239

(51) Int. Cl.
*H01L 27/108* (2006.01)
(52) U.S. Cl. ............... 257/310; 257/E21.645; 438/253; 438/396; 438/785; 365/148
(58) Field of Classification Search .......... 257/296, 257/306, 310, E29.17, E21.613, E21.645, 257/2, 3, 4, 5; 438/238, 239, 253, 381, 396, 761, 763, 778, 785; 365/148
See application file for complete search history.

(56) References Cited

U.S. PATENT DOCUMENTS 7,719,001 B2 * 5/2010 Nomura et al. .............. 257/40
2007/0267675 A1 * 11/2007 Cho et al. .................. 257/306

FOREIGN PATENT DOCUMENTS

| KR | 100622268 B1 | 9/2006 |
| KR | 10-0682908 | 2/2007 |
| KR | 100785509 B1 | 12/2007 |

* cited by examiner

*Primary Examiner* — Matthew Landau
*Assistant Examiner* — Colleen E Snow
(74) *Attorney, Agent, or Firm* — Volentine & Whitt, PLLC (57) ABSTRACT

A resistive memory device includes a first electrode, a resistive oxidation structure and a second electrode. The resistive oxidation structure has sets of oxidation layers stacked on the first electrode. Each set is made up of a first metal oxide layer and a second metal oxide layer which is disposed on and is thinner than the first metal oxide layer. The first metal oxidation layer of the first one of the sets of oxidation layers contacts an upper surface of the first electrode. The second electrode is formed on the resistive oxidation structure. The resistance of the oxidation structure can be changed by an electric field.

7 Claims, 11 Drawing Sheets

RESISTIVE RANDOM ACCESS MEMORY

This application claims priority under 35 USC §119 to Korean Patent Application No. 2008-136239 filed on Dec. 30, 2009 in the Korean Intellectual Property Office (KIPO).

BACKGROUND

The inventive concept relates to a resistive random access memory (RRAM) and to a method of manufacturing an RRAM.

Generally speaking, an RRAM is a non-volatile memory device which stores data using changes in resistance of a resistive oxide layer. The resistive oxide layer consists of a single layer of an oxide. The RRAM is capable of having a high degree of integration and of being driven by a lower power supply compared with a conventional dynamic random access memory (DRAM) and a flash memory device. However, a conventional RRAM still consumes a relatively large amount of power and its switching speed is relatively low, i.e., it is difficult to switch the state of the RRAM quickly. Similarly, it is not easy to manufacture an RRAM having a high capacity of over a giga byte. Accordingly, an RRAM device that has a high speed of response, good durability and good data storage and retention characteristics is desired.

SUMMARY

The inventive concept provides a resistive random access memory unit having a first electrode, a resistive oxidation structure made up of sets of oxidation layers stacked one atop the other on the first electrode, and a second electrode on the resistive oxidation structure. The oxidation layers of each set consist of a first metal oxide layer and a second metal oxide layer disposed directly on the first metal oxide layer. The second metal oxide layer of each of the sets is thinner than the first metal oxide layer on which it is disposed. Also, one of the first metal oxide layers of the resistive oxide structure contacts an upper surface of the first electrode.

The inventive concept similarly provides a method of manufacturing a resistive random access memory unit including steps of forming a first electrode, forming a resistive oxidation structure on the first electrode, wherein the resistive oxidation structure has sets of oxidation layers stacked one atop the other, the oxidation layers of each set consist of a first metal oxide layer and a thinner second metal oxide layer disposed directly on the first metal oxide layer, and one of the first metal oxide layers contacts an upper surface of the first electrode, and forming a second electrode on the resistive oxidation structure.

BRIEF DESCRIPTION OF THE DRAWINGS

The inventive concept will be more clearly understood from the following detailed description of the preferred embodiments thereof taken in conjunction with the accompanying drawings. That is, FIGS. 1 to 18 of the accompanying drawings illustrate non-limiting examples of the inventive concept.

DETAILED DESCRIPTION OF THE PREFERRED EMBODIMENTS

Various embodiments and examples of embodiments of the inventive concept will be described more fully hereinafter with reference to the accompanying drawings. In the drawings, the sizes and relative sizes and shapes of elements, layers and regions may be exaggerated for clarity, especially when shown in section. For example, the shapes of elements and regions may vary from those illustrated as the result of limitations imposed by manufacturing techniques and/or tolerances.

Also, terms such as "upper" and the like are used herein for ease in describing one element or feature's relationship to another element(s) or feature(s) as illustrated in the figures. It will thus be understood that such terms are specially relative terms and may thus describe the orientation of one element or feature relative to another element(s) or feature(s) in an actual device which, when in use, is oriented differently from that shown in the drawings, e.g., is inverted with respect to the orientation shown in the drawings.

Figure 1:
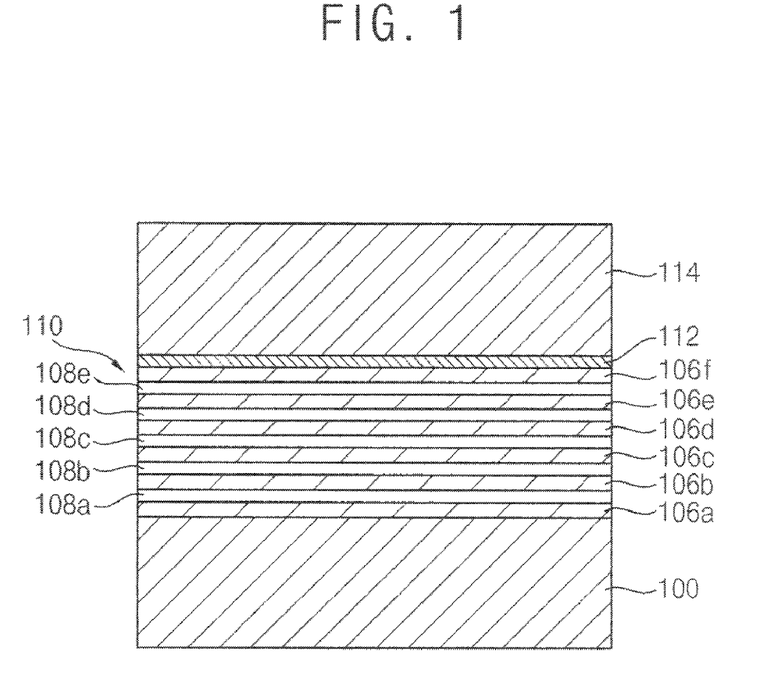
FIG. 1 is a cross-sectional view of an embodiment of a resistive random access memory (RRAM) unit in accordance with the inventive concept.

Referring now to FIG. 1, an RRAM memory unit includes a first electrode 100, a second electrode 114 and a resistive oxidation structure 110. The first electrode 100, the resistive oxidation structure 110 and the second electrode 114 are stacked one atop the other.

The first and second electrodes 100 and 114 may each comprise a metal (plate-like electrode). For example, each of the first and second electrodes 100 and 114 may comprise platinum (Pt), iridium (Ir), ruthenium (Ru), titanium (Ti), titanium nitride (TiN), tungsten (W), tantalum (Ta), aluminum (Al), zirconium (Zr), hafnium (Hf), nickel (Ni), copper (Cu), cobalt (Co), iron (Fe), vanadium (V), yttrium (Y), molybdenum (Mo), or a metal of the lanthanum group. The metals of the lanthanum group include lanthanum (La), cerium (Ce), praseodymium (Pr), gadolinium (Gd), dysprosium (Dy), erbium (Er), and ytterbium, (Yb).

The first and second electrodes 100 and 114 may be of substantially the same material or may be of substantially different materials. Also, the first and second electrodes 100 and 114 may be of materials doped with nitrogen atoms.

In the embodiment of FIG. 1, the first and second electrodes 100 and 114 each comprise iridium.

The resistive oxidation structure 110 has a structure comprising a stack of alternately disposed first and second metal oxidation layers in which each second metal oxidation layer is of material different from that of the first metal oxidation layer on which it is stacked. Thus, the resistive oxidation structure 110 comprises sets of oxidation layers stacked one atop the other, wherein each set includes a first oxidation metal layer and a second metal oxidation layer disposed on the first metal oxidation layer. For example, in the embodiment of FIG. 1, the resistive oxidation structure 110 comprises first metal oxidation layers 106a, 106b, 106d, 106e and 106f, and second metal oxidation layers 108a, 108b, 108c, 108d and 108e stacked on the first metal oxidation layers 106a, 106b, 106d, and 106e, respectively. Also, in this example, the metal oxidation layers 106a, 106b, . . . 106f are all of substantially the same material, and have the same thicknesses. Likewise, in this example, the second metal oxidation layers 108a, 108b, . . . 108e are all of material substantially the same material, and have the same thicknesses. In any case, the first metal oxidation layer of each set has a resistance larger than that of the second metal oxidation layer stacked on it in the set.

The first metal oxidation layer 106a may comprise nickel oxide (NiO), titanium oxide (TiO), tungsten oxide (WO), tantalum oxide (TaO), aluminum oxide (AlO), zirconium oxide (ZrO), hafnium oxide (HfO), copper oxide (CuO), cobalt oxide (CoO), iron oxide (FeO), vanadium oxide (VO), yttrium oxide (YO), or lanthanide.

The second metal oxidation layer 108a may also comprise nickel oxide (NiO), titanium oxide (TiO), tungsten oxide (WO), tantalum oxide (TaO), aluminum oxide (AlO), zirconium oxide (ZrO), hafnium oxide (HfO), copper oxide (CuO), cobalt oxide (CoO), iron oxide (FeO), vanadium oxide (VO), yttrium oxide (YO), or lanthanide. However, as mentioned above, the second metal oxidation layer 108a is of material different from that of the first metal oxidation layer 106a. In an example of the embodiment of FIG. 1, each second metal oxidation layer is a metal-rich metal oxide layer.

Furthermore, and still referring to FIG. 1, the uppermost layer of the resistive oxidation structure 110 may be either a first metal oxidation layer, e.g., the first metal oxidation layer 106f or may be a second metal oxidation layer. Furthermore, a metal layer 112 may be interposed between the resistive oxidation structure 110 and the second electrode 114. The layer 112 may be of the same metal which constitutes the second metal oxidation layers.

The resistive oxidation structure 110 has a thickness of about 50 to 300 Å. Otherwise an RRAM including the resistive oxidation structure 110 would not be operable as a memory device. Preferably, the first metal oxidation layer is thicker than the second metal oxidation layer stacked on it in the set. Using the set of first and second metal oxidation layers 106a and 108a as an example, the first metal oxidation layer 106a may have a thickness of about 10 to 30 Å, the second metal oxidation layer 108a may have a thickness of about 2 to 10 Å, and the first metal oxidation layer 106a is thicker than the second metal oxidation layer 108a.

The RRAM unit stores data by changing the resistance of the resistive oxidation structure 110 with an electric field generated between the first and second electrodes 100 and 114. More specifically, a state of the resistive oxidation structure 110 can be changed between a high resistance (or set) state and a low resistance (or reset) state. Electric current scarcely flows between the first and second electrodes 100 and 114 when the RRAM unit is in the high resistance state. Hence, the high resistance state corresponds to an off-state. On the other hand, electric current readily flows between the first and second electrodes 100 and 114 when the RRAM unit is in the low resistance state and hence, the low resistance state corresponds to an on-state. The difference in the magnitude of the current flowing through the RRAM unit, when the RRAM unit is in the on and off states, is great for the state of the RRAM unit to be discerned. That is, the ability of the unit to serve as a memory stems from the fact that the logic (on/off) state of the unit can be easily read.

In the examples of the first embodiment of FIG. 1 described above, the electric current (current pulse necessary to program the RRAM unit to the low resistance state) would be excessive if the resistive oxidation structure 110 were to have only one or two sets each including one of the first metal oxidation layers and one of the second metal oxidation layers. On the other hand, the resistive oxidation structure 110 would be too thick if the resistive oxidation structure 110 were to have eleven or more sets of the first and second metal oxidation layers. Thus, the resistive oxidation structure 110 has three to ten sets of the first and second metal oxidation layers. Therefore, an RRAM device including the resistive oxidation structure 110, according to the inventive concept, may have a reset current of several tens of microamperes, which is significantly lower than that of a conventional RRAM having a resistive oxidation structure including a nitride oxide layer or a titanium oxide layer.

In an example of the embodiment of FIG. 1, the first metal oxidation layers are each a nickel oxide layer having a thickness of about 18 to about 22 Å, and the second metal oxidation layers are each a titanium oxide layer having a thickness of about 4 to about 7 Å. The resistive oxidation structure 110 including stacked sets of the nickel oxide and titanium oxide layers has an overall thickness of about 240 to 250 Å. Also, a titanium layer (constituting metal layer 112) is interposed between the resistive oxidation structure 110 and the second electrode 114.

FIGS. 2 to 7 illustrate a method of manufacturing an RRAM unit of the type shown in FIG. 1.

Figure 2:
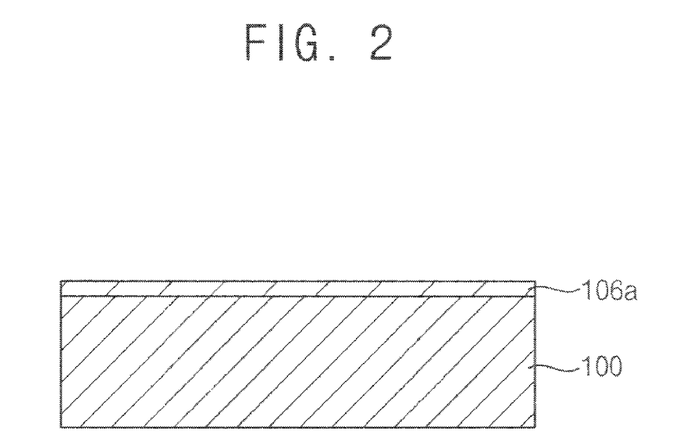
FIGS. 2 to 7 are each a cross-sectional view of a structure and together illustrate an embodiment of a method of manufacturing an RRAM unit of the type shown in FIG. 1.

Referring to FIG. 2, a first electrode 100 is formed on a substrate (not illustrated in FIG. 2 but which may be a layer such as an interlayer insulating layer, for example). The first electrode 100 may be formed of metal. For example, the first electrode 100 may be formed of platinum (Pt), iridium (Ir), ruthenium (Ru), titanium (Ti), titanium nitride (TiN), tungsten (W), tantalum (Ta), aluminum (Al), zirconium (Zr), hafnium (Hf), nickel (Ni), copper (Cu), cobalt (Co), iron (Fe), vanadium (V), yttrium (Y), molybdenum (Mo), or a metal of the lanthanum group. The metals of the lanthanum group include lanthanum (La), cerium (Ce), praseodymium (Pr), gadolinium (Gd), dysprosium (Dy), erbium (Er), and ytterbium, (Yb). Also, the first electrode 100 may be formed by a physical vapor deposition (PVD) process, a chemical vapor deposition (CVD), or an atomic layer deposition (ALD) process. Subsequently, the first electrode 100 may be doped with nitrogen atoms. In an example of the method, the first electrode 100 is formed of iridium (on a layer not shown in this figure) by a PVD process.

A first metal layer is then formed on the first electrode 100. The first metal layer may comprise platinum (Pt), iridium (Ir), ruthenium (Ru), titanium (Ti), titanium nitride (TiN), tungsten (W), tantalum (Ta), aluminum (Al), zirconium (Zr), hafnium (Hf), nickel (Ni), copper (Cu), cobalt (Co), iron (Fe), vanadium (V), yttrium (Y), molybdenum (Mo), or a metal of the lanthanum group. The first metal layer may be formed by carrying out a PVD process using the first electrode 100 as a substrate. The first metal layer is then oxidized to form a first metal oxidation layer 106a. The oxidation process is preferably carried out until the first metal oxidation layer 106a has a thickness of about 10 to about 30 Å. The oxidation process may be a plasma oxidation or a radical oxidation process.

For example, a layer of nickel having a thickness of about 10 to about 15 Å is formed by a sputtering process. The nickel layer is then oxidized by a plasma oxidation process so that a layer of nickel oxide is formed as a first metal oxidation layer 106a. Preferably, the first metal oxidation layer 106a has a thickness of about 20 to 30 Å.

Figure 3:
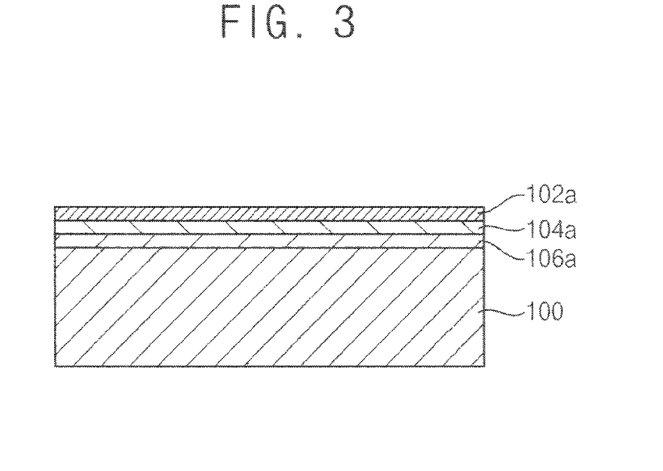

Referring to FIG. 3, a second metal layer 104a of material different from that of the first metal layer is formed on the first metal oxidation layer 106a. Preferably, the second metal layer 104a is formed of metal having a resistance smaller than that of the first metal layer. The second metal layer 104a may be formed of platinum (Pt), iridium (Ir), ruthenium (Ru), titanium (Ti), titanium nitride (TiN), tungsten (W), tantalum (Ta), aluminum (Al), zirconium (Zr), hafnium (Hf), nickel (Ni), copper (Cu), cobalt (Co), iron (Fe), vanadium (V), yttrium (Y), molybdenum (Mo), or a metal of the lanthanum group.

The second metal layer 104a may be formed by a PVD process. Also, the second metal layer 104a is preferably formed to a thickness smaller than that of the first metal layer. For example, the second metal layer 104a is formed to a thickness of about 3 to about 10 Å. In an example of the embodiment of FIGS. 2 to 7, the second metal layer 104a is formed by depositing titanium to a thickness of about 3 to about 5 Å on the first metal oxidation layer 106a.

Next, a third metal layer 102a of substantially the same material as the first metal layer is formed on the second metal layer 104a. The third metal layer 102a may be formed by a PVD process.

Figure 4:
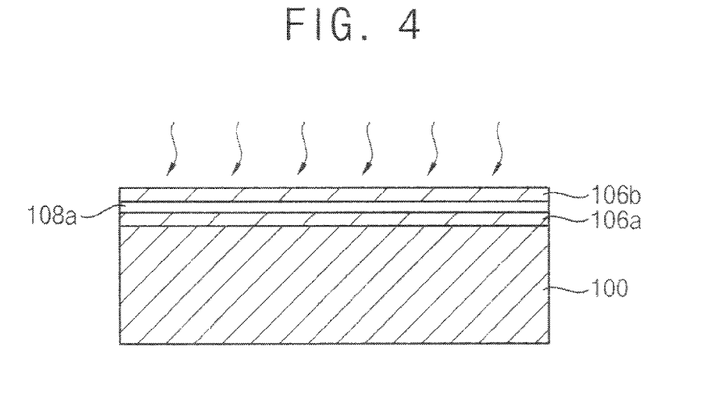

Referring to FIG. 4, the second metal layer 104a and the third metal layer 102a are oxidized in single oxidation process to form a second metal oxidation layer 108a and a third metal oxidation layer 106b. The oxidation process may be a plasma oxidation process or a radical oxidation process. For example, the third metal layer 102a is oxidized using oxygen in a plasma state (oxygen plasma). In this process, the third metal oxidation layer 106b is preferably formed to a thickness of about 10 to about 30 Å, and the second metal oxidation layer 108a is preferably formed to a thickness of about 5 to about 10 Å.

Furthermore, the second metal layer 104a is also oxidized to form the second metal oxidation layer 108a when the third metal layer 102a is converted into the second metal oxidation layer 108a. At this time, the second metal layer 104a is not directly exposed to the plasma because of the third metal layer 102a. Thus, the second metal layer 104a is not thoroughly oxidized and hence, the metal oxidation layer 108a includes an excessive amount of metal, i.e., is metal rich. More specifically, only an upper portion of the second metal layer 104a is oxidized.

In an example of this process, the second metal oxidation layer 104a is a metal-rich titanium oxide layer having a thickness of about 5 to about 10 Å. The third metal oxidation layer 106b is a nickel oxide layer having a thickness of about 20 to about 30 Å.

Figure 5:
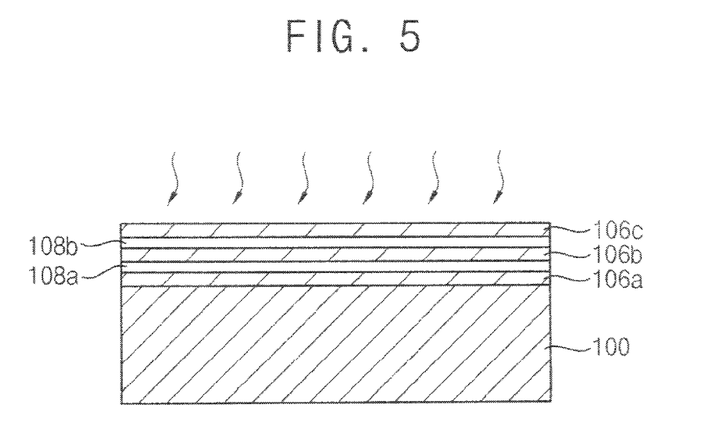

Referring to FIG. 5, a fourth metal layer (not illustrated) of substantially the same material as the second metal layer is formed on the third metal oxidation layer 106b. A fifth metal layer (not illustrated) of substantially the same material as the third metal layer is formed on the fourth metal layer. The fifth metal layer and the fourth metal layer are oxidized in a single oxidation process to form a fifth metal oxidation layer 106c and the fourth metal oxidation layer 108b. The oxidation process used to form the fifth metal oxidation layer 106c and the fourth metal oxidation layer 108b may be the same as that described above with reference to FIG. 4 and therefore, a description of the process will not be repeated here.

Figure 6:
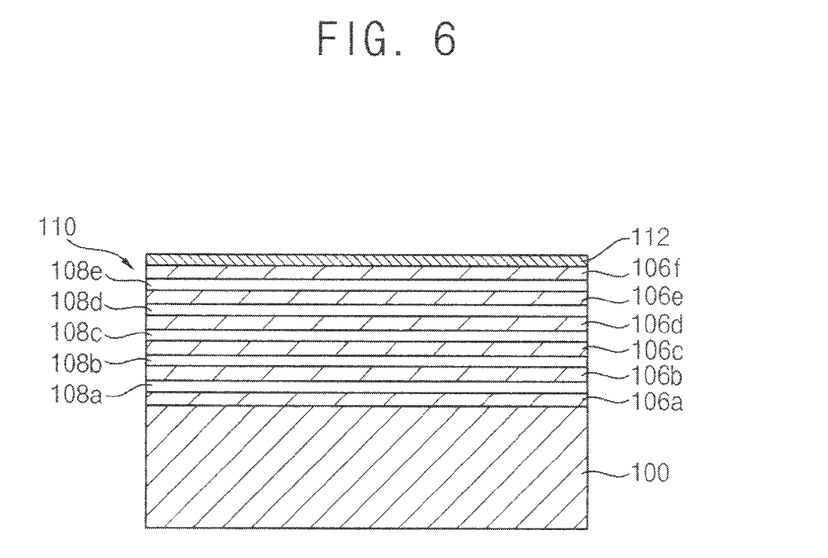

Referring to FIG. 6, the above-described processes of forming two metal layers and oxidizing the two metal layers at once through a single oxidation process are repeatedly performed to form a resistive oxidation structure 110 of a desired thickness. In an example of this embodiment of a method of forming a RRAM unit, a nickel oxide layer and a metal-rich titanium oxide layer are repeatedly formed to form the resistive oxidation structure 110. The characteristics of the resistive oxidation structure may be the same as those described above with reference to the RRAM unit of FIG. 1.

Still referring to FIG. 6, a metal layer 112, of substantially the same material as the second metal layer, is formed on the resistive oxidation structure 110. For example, a titanium layer is formed on the resistive oxidation structure 110. However, the metal layer 112 is optional in this embodiment of a method of forming a RRAM unit and thus, examples of this embodiment may omit the forming of a metal layer on the resistive oxidation structure 110.

Figure 7:
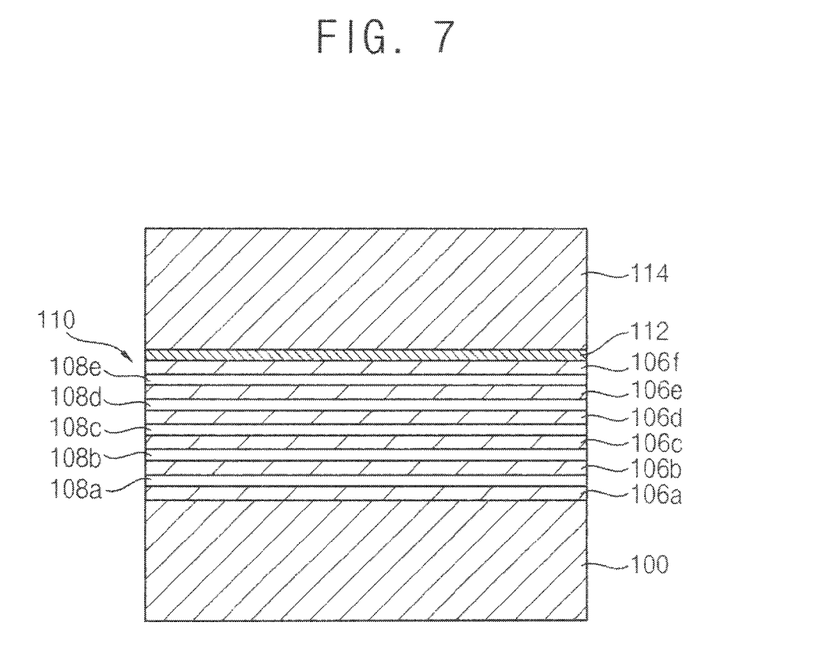

Referring to FIG. 7, a second electrode 114 is formed on the metal layer 112. The second metal layer 114 may be formed of metal. Also, the second metal layer may be formed by a PVD process, a CVD process, or an ALD process. For example, the second electrode 114 may be formed using iridium by a PVD process. Next, an upper portion of the second electrode 114 may be doped with nitrogen atoms.

Another embodiment of a method of manufacturing an RRAM unit of the type shown in and described with reference to FIG. 1 will now be described. A first electrode 100 is formed on a substrate (a layer such as an interlayer insulating layer) in a manner as described with reference to FIG. 2. A first metal oxidation layer (106a in FIG. 1) is formed on the first electrode 100 by forming a metal layer on the electrode 100 and then oxidizing the metal layer using a PVD process or an ALD process. Then, a second metal oxidation layer is formed on the first metal oxidation layer (106a) by forming a metal layer on the first metal oxidation layer (106a) and oxidizing the metal layer a PVD process or an ALD process. These processes of forming metal oxidation layers are repeatedly carried out on the first electrode 100 to form a resistive oxidation structure 110. A second electrode 114 is then formed on the resistive oxidation structure 110 in the manner described above with reference to FIG. 7.

Another embodiment of a method of manufacturing an RRAM unit of the type shown in and described with reference to FIG. 1 will now be described. A first electrode 100 is formed on a substrate (a layer such as an interlayer insulating layer) in a manner as described with reference to FIG. 2. A first metal layer and a second metal layer of material different from that of the first metal layer are then formed sequentially on the first electrode 100, each by a PVD process. This sequential forming of first and second metal layers of different material is repeated on the first electrode 100 to form a preliminary resistive oxidation structure. The preliminary resistive oxidation structure is then oxidized by a plasma oxidation process or a radical oxidation process to form the resistive oxidation structure 110. That is, all of the metal layers are oxidized at once by the oxidation process. Thus, the metal layers are formed to be relatively thin so that they may all be oxidized at once, i.e., by a single oxidation process. A second electrode 114 is then formed on the resistive oxidation structure 110 in the manner described above with reference to FIG. 7.

Figure 8:
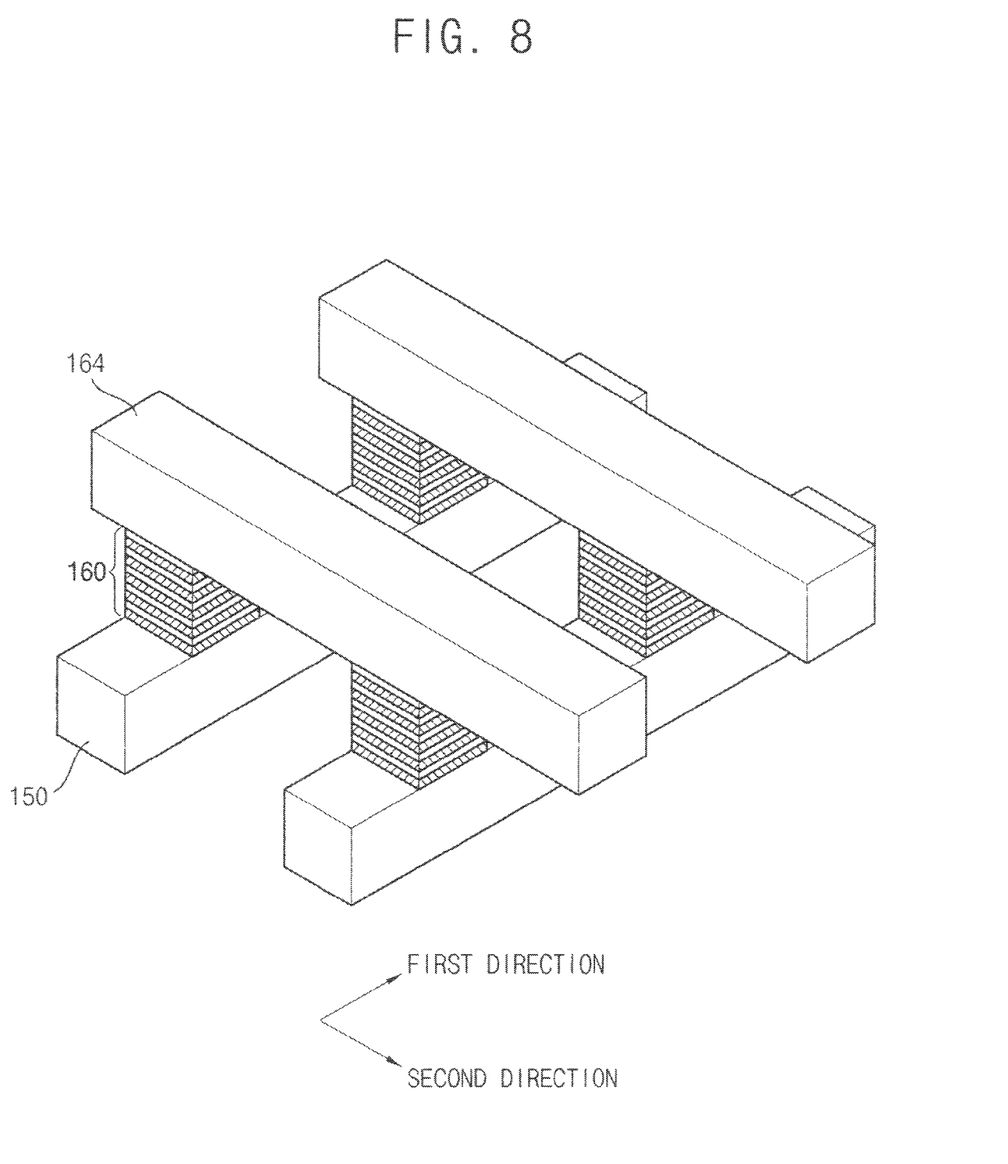
FIG. 8 is a perspective view of an RRAM array according to the inventive concept.

FIG. 8 illustrates an embodiment of an RRAM array according to the inventive concept. FIG. 8 is an equivalent circuit diagram of the array.

The RRAM device includes a first electrode 150, a second electrode 164 and a resistive oxidation structure 160. The resistive oxidation structure 160 has a structure substantially the same as that of several of the resistive oxidation structures 110 shown in and described with reference to FIG. 1.

Referring to FIG. 8, the first electrode 150 comprises a linear element(s) extending lengthwise in a first direction. The second electrode 164 comprises a linear element(s) extending lengthwise in a second direction substantially perpendicular to the first direction.

The resistive oxidation structure 160 is interposed between the first electrode 150 and the second electrode 164 in a space across which segments of the electrodes 150 and 164 face each other. A unit of the RRAM array is made up of respective segments of the first electrode 150 and the second electrode 164 that face each other, i.e., that are juxtaposed in a third direction perpendicular to the first and second directions, and a discrete portion of the resistive oxidation structure 160 interposed between the juxtaposed segments of the first electrode 150 and the second electrode 164. Thus, the units are disposed in an array, e.g., a 2×2 array as shown in FIG. 8.

Figure 9:
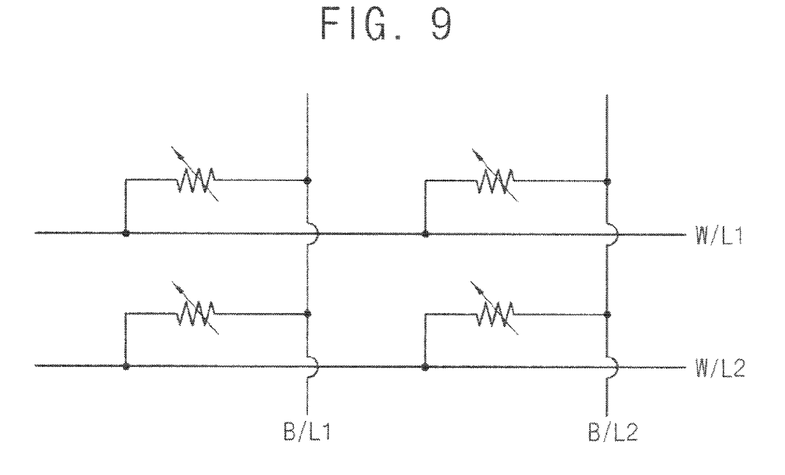
FIG. 9 is an equivalent circuit diagram of the RRAM array shown in FIG. 8.

Referring to FIGS. 8 and 9, the first electrode 150 may serve as a bit line(s) (e.g., B/L1 and B/L2). The second electrode 164 may serve as a word line(s) (e.g., W/L1 and W/L2). A voltage applied to the bit and word lines is controlled such that an electric field is applied to only a selected bit line/lines and a selected word line/lines, whereby the cells (each comprising a respective RRAM unit) can be selectively operated.

Accordingly, a memory device may be provided with an RRAM array. Also, each cell of such a memory device may have a relatively small area. That is, a memory device comprising an RRAM array, according to the inventive concept, may be highly integrated and have a high capacity.

Figure 10:
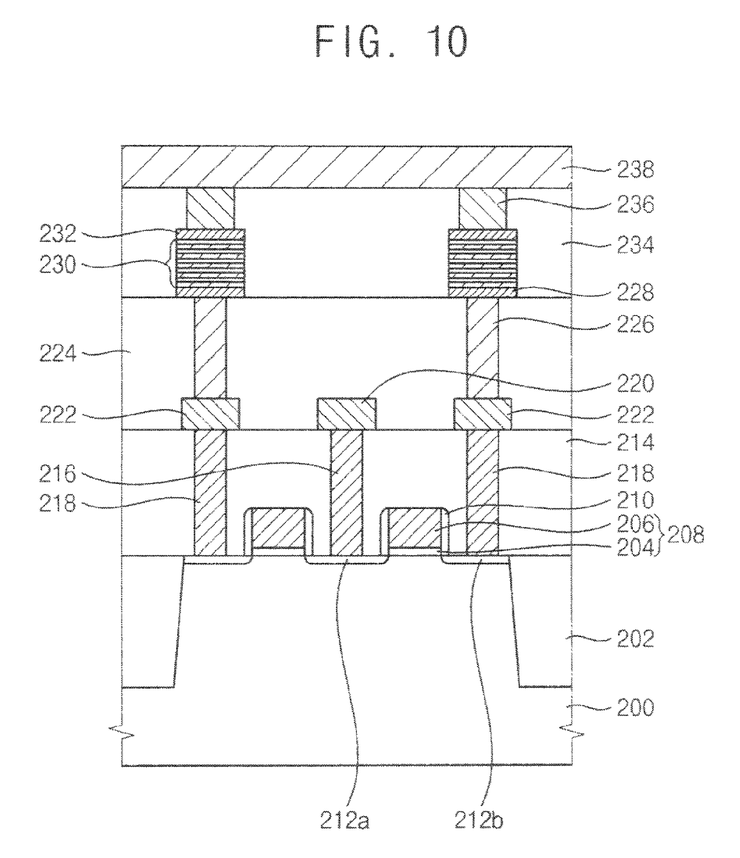
FIG. 10 a cross-sectional view of an embodiment of RRAM device in accordance with the inventive concept.

FIG. 10 illustrates an embodiment of an RRAM device in accordance with the inventive concept.

The embodiment of the RRAM device of FIG. 10 has an array of unit cells. Each unit cell includes a RRAM unit of the type shown in and described with reference to FIG. 1, and a MOS transistor as a switching device.

More specifically, the RRAM device includes substrate 200 having an isolation layer 202 and an active region. A MOS transistor is formed on the active region. Each MOS transistor includes a gate structure 208 and source and drain regions 212a and 212b. The gate structure 208 includes a gate insulation layer 204 and a gate electrode 206. The source and drain regions 212a and 212b are formed in the substrate 200 adjacent to the gate structure 208. A spacer 210 is formed on each sidewall of the gate structure. The spacers 210 may be of silicon nitride.

A first insulating interlayer 214 is disposed on the substrate 200 over the MOS transistors. A respective first contact plug 216, extending through the first insulating interlayer 214, is electrically connected to each source region 212a. Although not seen in the figure, a plurality of the first plugs 216 may be disposed in a line along a (first) direction perpendicular to the plane of the figure. A respective second contact plug 218, extending through the first insulating interlayer 214, is electrically connected to each drain region 212b.

A first conductive pattern 220 contacting each first contact plug 216 is formed on the first insulating interlayer 214. A second conductive pattern 222 contacting each second contact plug 218 is also formed on the first insulating interlayer 214.

The first conductive pattern 220 is a pattern of linear elements each extending lengthwise in a first direction. Also, each linear element of the first conductive pattern 220 may contact a line of first contact plugs 216 spaced along the first direction. Accordingly, the first conductive pattern 220 may serve as a bit line(s).

The second conductive pattern 222 is connected to the second contact plugs 218 and comprises elements each having the form of an island (an isolation shape). A second insulating interlayer 224 is disposed on the first insulating interlayer 214 over the first and second conductive patterns 220 and 222. A respective third contact plug 226, extending through the second insulating interlayer 224, is electrically connected to each element of the second conductive pattern 222.

A respective first electrode 228, a resistive oxidation structure 230 and a second electrode 232 are disposed on each third contact plug 226. Each unit including a first electrode 228, resistive oxidation structure 230 and second electrode 232, is substantially the same as that shown in and described with reference to FIG. 1. Thus, the units each including a first electrode 228, resistive oxidation structure 230 and second electrode 232 have an isolation pattern in which each unit has the form of an island on the second insulating interlayer 224. The pattern may be in the form of a two-dimensional array, e.g., the units may be disposed in a 2×2 array as will be seen from the description that follows with respect to FIG. 11.

A third insulating interlayer 234 is disposed on the second insulating interlayer 224 over the units each including a first electrode 228, resistive oxidation structure 230 and second electrode 232. A respective fourth contact plug 236, extending through the third insulating interlayer 234, is electrically connected to each second electrode 232. Thus, the fourth contact plugs may be disposed in an array. A third conductive pattern 238, disposed on the third insulating interlayer 234, contacts the fourth contact plugs 236.

The third conductive pattern 238 has a linear element(s) each extending lengthwise in a second direction substantially perpendicular to the first direction. The third conductive pattern 238 may contact a plurality of the fourth contact plugs 236 spaced in the second direction in the aforementioned array. Accordingly, the third conductive pattern 238 may serve as a word line(s).

Note, however, the fourth contact plugs 236 may be omitted in which case the third conductive pattern 238 is directly connected to, i.e., contacts, the second electrodes 232. Also, in an example of the embodiment of the RRAM device in which the fourth contact plugs 236 are omitted, the second electrode 232 may be configured to serve as a word line(s). In this case, the second electrode 232 has a linear element(s) extending lengthwise along the second direction.

Figure 11:
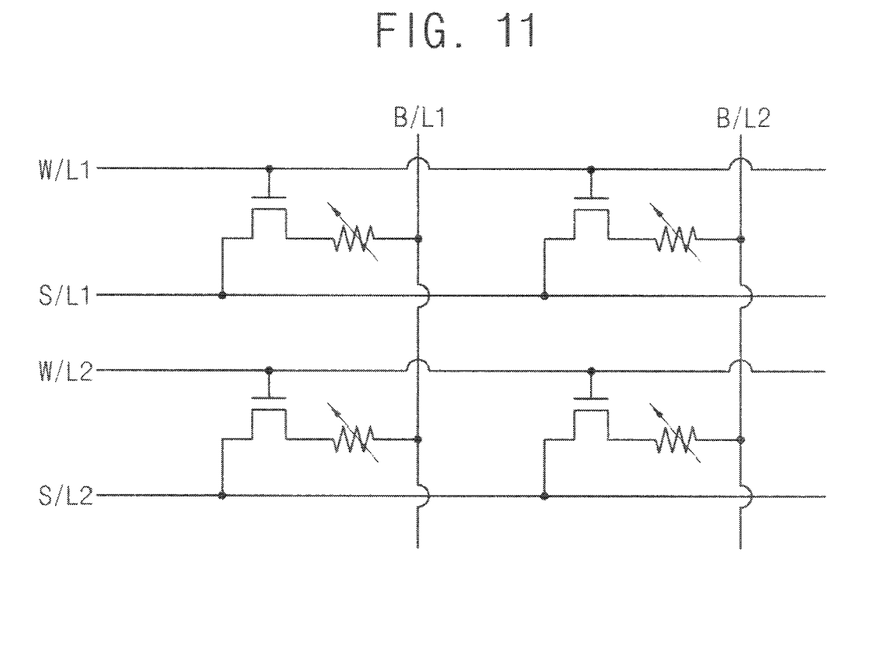
FIG. 11 is an equivalent circuit diagram of an embodiment of a RRAM device according to the inventive concept.

FIG. 11 is an equivalent circuit diagram of an embodiment of an RRAM device according to the inventive concept. This circuit diagram shows the array of cells, wherein each cell includes a MOS transistor and a variable resistance embodied as a unit of the type shown in and described with reference to FIG. 1. Data may be distinguished using the variable resistance. Elements of a RRAM device having the circuitry illustrated in FIG. 11 will be referred to using reference numerals that designate similar elements in the embodiment shown in FIG. 10.

Referring to FIG. 11, source regions of MOS transistors arrayed along a first direction are electrically connected to a signal line (a respective one of the signal lines S/L1 and S/L2). Each signal line (S/L1 or SL2) may be a linear element of a first conductive pattern 220.

Drain regions of the MOS transistors are electrically connected to the variable resistances, respectively. Each variable resistance is embodied as a unit in which a first electrode 228, resistive oxidation structure 230 and second electrode 232 are stacked.

Second electrodes 232 arrayed along a second direction, substantially perpendicular to the first direction, are electrically connected to a bit line (a respective one of the bit lines B/L1 and BL2). The bit lines (B/L1 and BL2) may be embodied as a third conductive pattern 238.

A word line (W/L1 or W/L2) is connected in common with gate electrodes 206 of the MOS transistors.

RRAM devices embodied according to the inventive concept as described above with reference to FIGS. 10 and 11 have a resistive oxidation structure in which sets each of two metal oxide layers are stacked one atop the other, wherein the metal oxide layers of each set are of materials that are different from one another. Therefore, the reset electric current is minimal. Also, each cell has a selection transistor. The compliance current may be adjusted by controlling a gate voltage of the selection transistor. Also, a parasitic capacitance and signal noise are minimized.

FIGS. 12 to 15 are cross-sectional views illustrating a method of manufacturing an RRAM unit in FIG. 10.

Figure 12:
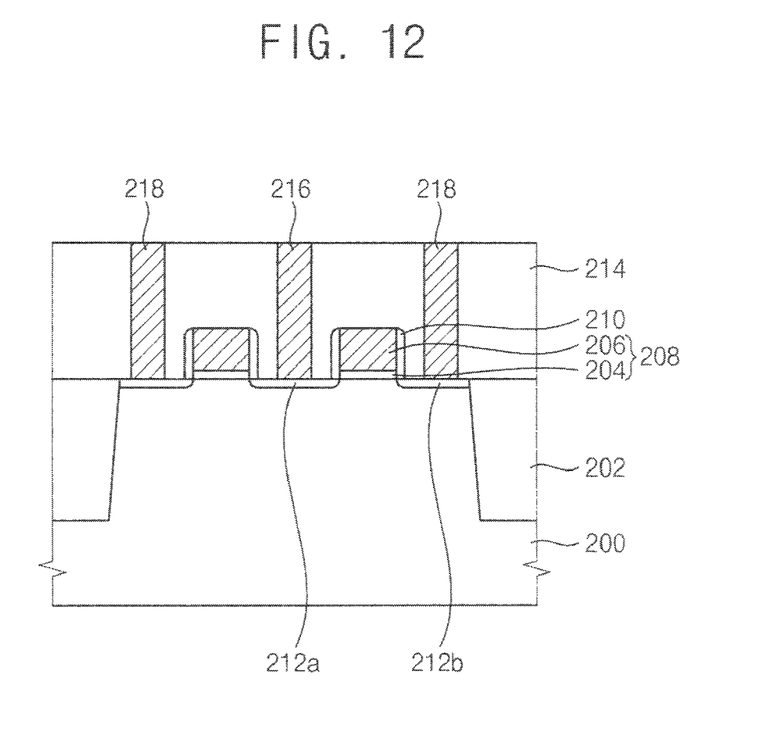
FIGS. 12 to 15 are each a cross-sectional view of a structure, and together illustrate an embodiment of a method of manufacturing an RRAM device of the type shown in FIG. 10, according to the inventive concept.

Referring to FIG. 12, an isolation layer 202 is formed in a substrate 200 by a shallow trench isolation process. The substrate 200 is thereby divided into an active region and an isolation region.

MOS transistors are formed on the active region of the substrate 200. More specifically, a silicon oxide layer is formed on the substrate by an oxidation process. A gate electrode layer is formed on the silicon oxide layer. The gate electrode layer and the silicon oxide layer are patterned to form gate structures 208 each including a gate insulation layer 204 and a gate electrode 206. Spacers 210 are formed on sidewalls of each gate structure 208 Impurities are implanted into the substrate adjacent to the gate structures 208 so that source and drain regions 212a and 212b are formed.

A first insulating interlayer 214 is formed on the substrate 200 to such a thickness as to cover the MOS transistors. The first insulating interlayer 214 may be formed by a CVD process.

A first contact hole exposing the source region 212a and second contact holes exposing the drain regions 212b are formed through the first insulating interlayer 214. The first and second contact holes may be formed by a process in which the first insulating interlayer 214 is dry etched.

A first conductive layer (not illustrated) is formed on the first insulating interlayer 214 to such a thickness as to fill the first and second contact holes. The first conductive layer is then planarized until the first insulating interlayer 214 is exposed. Accordingly, first and second contact plugs 216 and 218 are formed in the first and second contact holes.

Figure 13:
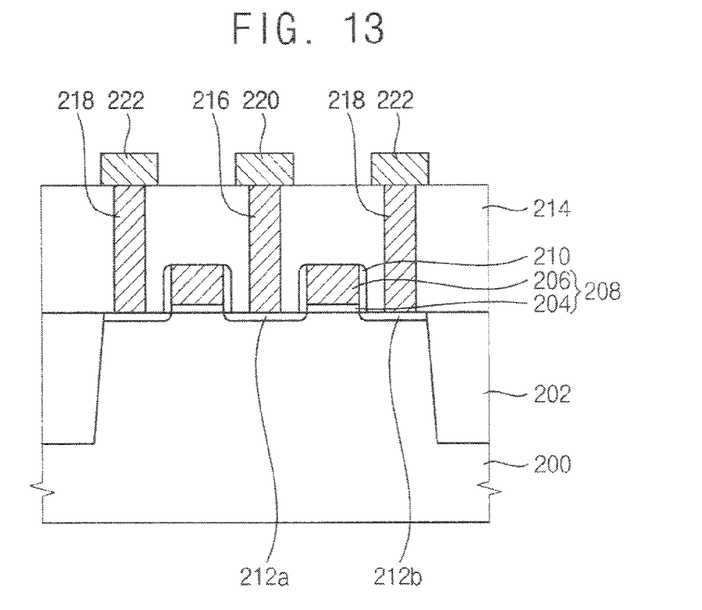

Referring to FIG. 13, a second conductive layer (not illustrated) is formed on the first insulating interlayer 214. The second conductive layer is patterned to form a first conductive pattern 220 contacting the first contact plugs 216 and a second conductive pattern 222 contacting the second contact plugs 218. The first conductive pattern 220 includes a linear element(s) extending lengthwise in a first direction. The second conductive pattern 222 is an isolation pattern made up of features each having the shape of an island.

In the example of this embodiment described above, the contact plugs 216 and 218 and the conductive patterns 220 and 222 are formed discretely. Alternatively, i.e., according to another example of this embodiment, a conductive layer is formed on the first insulating interlayer 214 to fill the contact holes. The conductive layer is then patterned to form the contact plugs 216 and 218 and the conductive patterns 220 and 222 at the same time.

Figure 14:
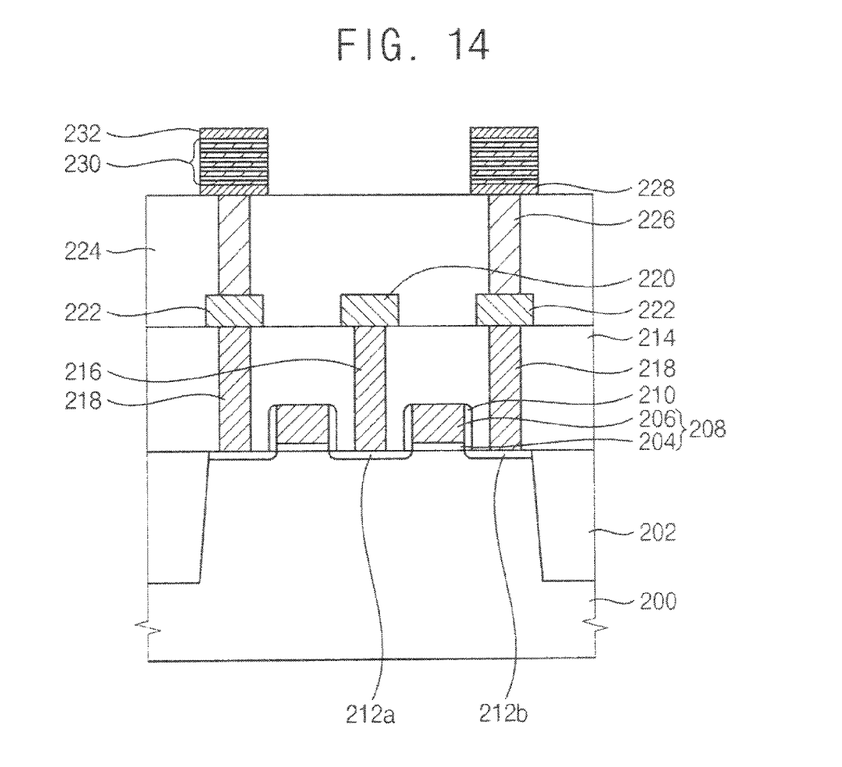

Referring to FIG. 14, a second insulating interlayer 224 is formed on the first insulating interlayer 214 to such a thickness as to cover the first and second conductive patterns 220 and 222. The second insulating interlayer 224 may be formed of silicon oxide by a CVD process.

Third contact holes are formed through the second insulating interlayer 224 to expose the second conductive pattern 222. A third conductive layer (not illustrated) is formed on the second insulating interlayer 224 to fill the third contact holes. The third conductive layer is planarized until the second insulating interlayer 224 are exposed to form third contact plugs 226 in the third contact holes, respectively.

A first electrode layer is formed on the second insulating interlayer 224. A preliminary resistive oxidation structure is formed on the first electrode layer. A second electrode layer is formed on the preliminary resistive oxidation structure. The processes forming the first electrode layer, the preliminary resistive oxidation structure and the second electrode layer and the compositions thereof may be substantially the same as those described with reference to FIGS. 2 to 7. The first electrode layer, the preliminary resistive oxidation structure and the second electrode layer are patterned to form units on the second insulating interlayer 224 each comprising a first electrode 228, a resistive oxidation structure 230 and a second electrode 232.

Figure 15:
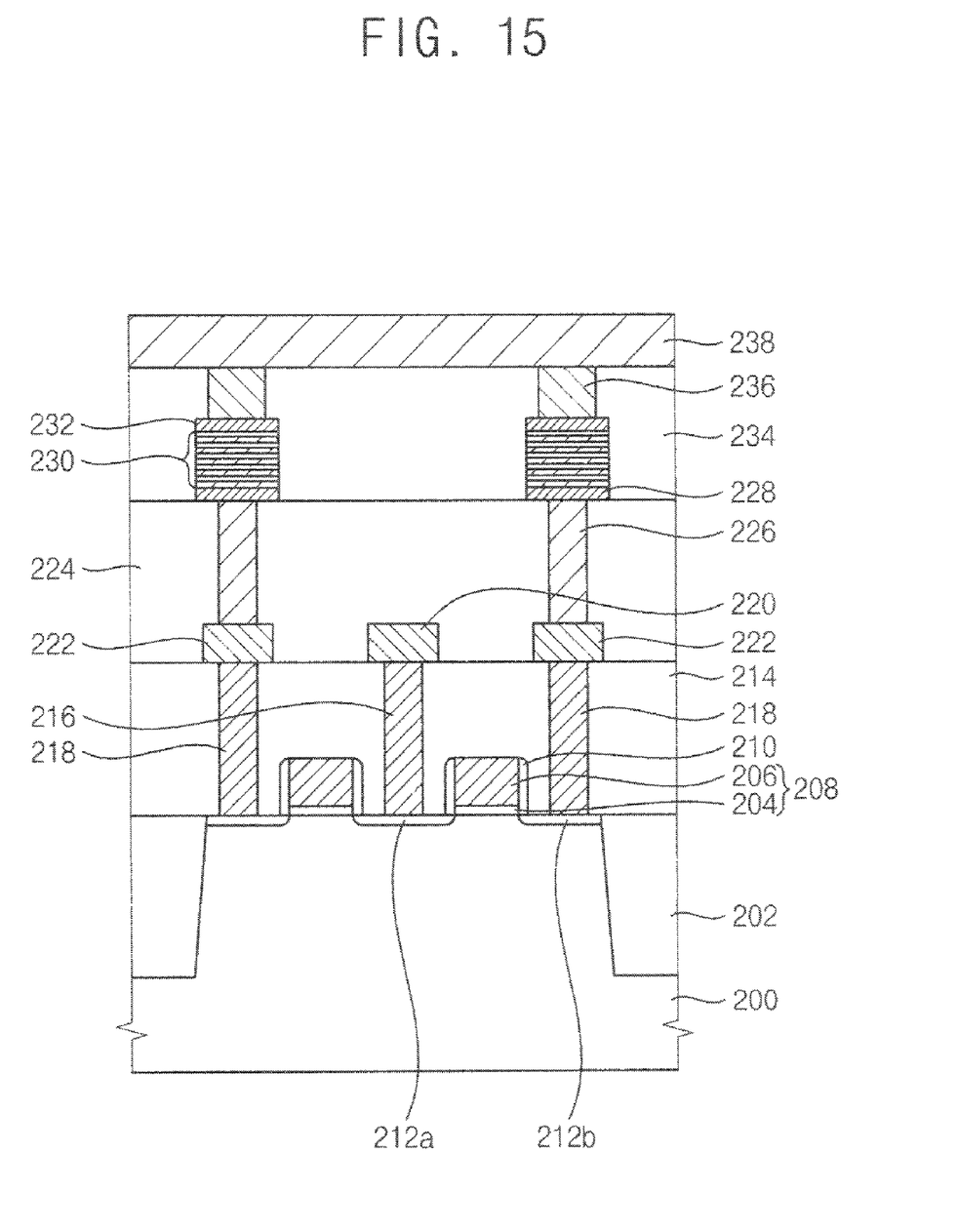

Referring to FIG. 15, a third insulating interlayer 234 is formed on the second insulating interlayer 224 to such a thickness as to cover the second electrode 232.

Fourth contact plugs 236 are formed in the third insulating interlayer 234 to contact the second electrodes 232, respectively. A third conductive pattern 238 is formed on the fourth contact plugs 236 and the third insulating interlayer 234. The third conductive pattern 238 is a pattern of linear elements each extending lengthwise along the second direction so as to serve as a word line.

Comparative Example

An RRAM including a first electrode of iridium, a resistive oxide layer of nickel oxide (NiO) and a second electrode of iridium was manufactured. The first electrode was formed to a thickness of 300 Å by a PVD process. The resistive oxide layer was formed by depositing nickel on the first electrode using a PVD process and oxidizing the nickel using a plasma oxidation process. The resistive oxide layer had a thickness of 150 Å. The second electrode was formed on the resistive oxide layer to a thickness of 200 Å by a PVD process.

Figure 16:
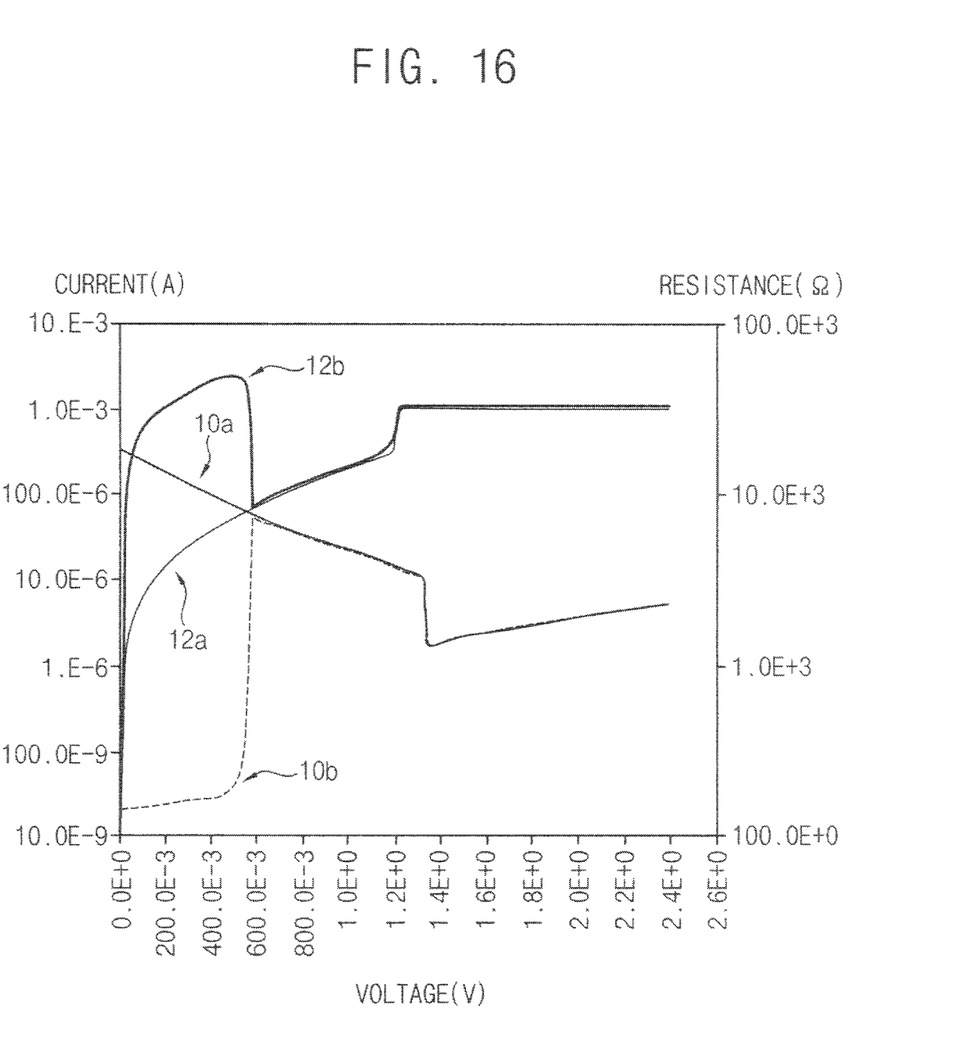
FIG. 16 is a graph illustrating electric current-voltage-resistance characteristics of a Comparative Example of an RRAM device.

FIG. 16 is a graph illustrating electric current-voltage-resistance characteristics of an RRAM device in accordance with the Comparative Example.

Referring to FIG. 16, reference numeral 10a denotes a plot illustrating the relationship between resistance of the NiO layer and the voltage applied between the first electrode and the second electrode when the NiO layer is in the high resistance state. Referring to FIG. 16, in operation a resistance of about 10 kΩ is provided when the NiO layer is in the high resistance state.

Reference numeral 10b denotes a plot illustrating the relationship between resistance of the NiO layer and the voltage applied between the first electrode and the second electrode when the NiO layer is in the low resistance state. In operation a resistance is about 200Ω is provided when the NiO layer is in the low resistance state.

Reference numeral 12a denotes a plot illustrating changes in current flowing through the RRAM device when the NiO layer is in a high resistance (set) state and the voltage applied between the first electrode and the second electrode is increased. In the Comparative Example, the compliance current is 0.01 amperes. That is, the maximum current flowing between the first and second electrodes when the RRAM of the Comparative Example is in the high resistance state will not exceed 0.01 amperes.

When the NiO layer of the RRAM device of the Comparative Example is in the high resistance state and the voltage applied to the first and second electrodes is increased, the resistance of the NiO layer gradually decreased so that current will flow through the NiO layer. In particular, the current flowing through the NiO layer increases remarkably when a voltage (for example, programming voltage) of a certain magnitude or greater is applied to the first and second electrodes. The programming voltage is applied as a pulse to the first and second electrodes to decrease the resistance of the NiO layer and thereby program the RRAM unit to the reset state.

Reference numeral 12b denotes a plot illustrating changes in current when the NiO layer is in a low resistance state and the voltage applied between the first electrode and the second electrode is increased. In this case, the current flowing through the NiO layer remarkably decreases when a voltage (for example, an erasing voltage) of a certain magnitude or greater is applied to the first and second electrodes.

As shown in FIG. 16, the reset current when the RRAM unit of the Comparative Example is in the reset state is about 3 mA. Thus, the RRAM device of the Comparative Example can not operate at a high speed and will consume a large amount of power.

Example According to Inventive Concept

An RRAM unit including a first electrode of iridium, a resistive oxide structure in which nickel oxide (NiO) and titanium oxide (TiO) layers are stacked on the first electrode, and a second electrode of iridium disposed on the resistive oxide structure, was manufactured by the processes described with reference to FIGS. 2 to 7.

Specifically, the first electrode of iridium was formed to a thickness of 300 Å by a PVD process.

A nickel (Ni) layer was formed on the first electrode. The nickel layer was oxidized by a plasma oxidation process to form a nickel oxide layer. Then, a titanium layer and a nickel layer were sequentially formed on the nickel oxide layer. The titanium layer and the nickel layer were oxidized in a single plasma oxidation process to form a titanium oxide layer and a nickel oxide layer. The process of forming a titanium layer and a nickel layer, and the process of oxidizing the titanium layer and the nickel layer were repeatedly performed.

In this Example, each of the nickel layers was formed by a PVD process to a thickness of about 10 Å. The nickel oxide layers each were formed to a thickness of about 20 Å. Each of the titanium layers was formed by a PVD process to a thickness of about 4 Å. The titanium oxide layers were each formed to a thickness of about 8 Å.

Also, ten of the nickel layers and nine of the titanium layers were formed. Thus, a respective titanium oxide layer was interposed between the nickel oxide layers of each adjacent pair. As a result, the resistive oxidation structure had a total thickness of about 240 Å. A titanium layer was formed on the resistive oxidation structure.

The second electrode of iridium was formed by a PVD process to a thickness of 200 Å.

Figure 17:
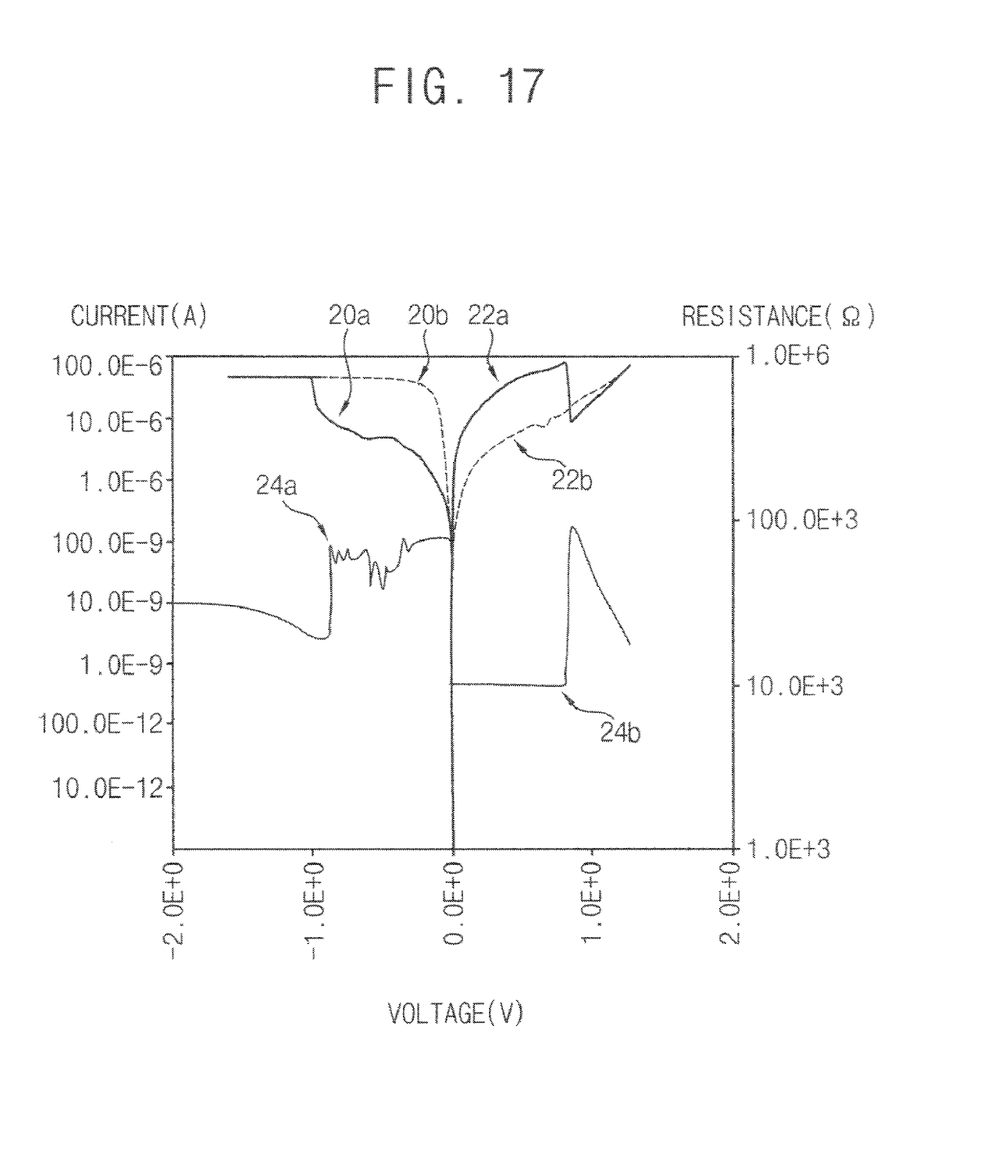
FIG. 17 is a graph illustrating electric current-voltage-resistance characteristics of an RRAM device embodied according to the inventive concept.

FIG. 17 is a graph illustrating electric current-voltage-resistance characteristics of the above-described Example of an RRAM unit according to the inventive concept.

The Example has a bipolar switching characteristic. For example, when a certain negative bias is applied to the RRAM unit, the RRAM unit has a high resistance (set) state. When a certain positive bias is applied to the RRAM device, the RRAM device has a low resistance (reset) state. More specifically, a negative bias is applied to the RRAM unit when the RRAM device is programmed, i.e., when the state is changed from the set state to the reset state. A positive bias is applied to the RRAM when the RRAM device is erased, i.e., when the state is changed from the reset state to the set state.

In FIG. 17, reference numeral 20a denotes a plot of the relationship between current and applied voltage when the resistive oxidation structure has a high resistance state and a negative voltage is applied to the RRAM unit. This plot shows the way in which a state of the RRAM unit can be changed from a set state to a reset state by applying a negative bias at which the resistance of the resistive oxide structure is decreased to a low value. That is, reference numeral 20 denotes a plot representative of a programming operation. When programming the RRAM unit, a pulse is applied to edges of the first and second electrodes to place the RRAM unit in a reset state.

Reference numeral 20b denotes a plot illustrating the relationship between current and applied voltage when the resistive oxidation structure has a reset state and a negative voltage is applied to the resistive oxidation structure.

Reference numeral 22a denotes a plot illustrating the relationship between current and voltage when the resistive oxidation structure has a reset state and a positive voltage is applied to the RRAM unit. When the applied positive voltage is high, the current is relatively high. Also, when the applied positive voltage exceeds a critical positive voltage (erasing voltage), the resistance of the resistive oxidation structure increases remarkably. Thus, a voltage pulse in excess of the erasing voltage can applied to the first and second electrodes to change the state of the RRAM device from a reset state to a set state.

As can be seen from the plot designated by reference numeral 22a, the RRAM unit of the Example according to the inventive concept has a reset current of about 50 µA. This reset current is about a sixtieth of that of the RRAM unit of the Comparative Example. Accordingly, an RRAM unit embodied according to the inventive concept, having such a reset current on an order of about several tens of microamperes, may be operated at a relatively high speed and with a lower consumption of power than a conventional RRAM unit.

Reference numeral 24a denotes a plot illustrating changes in the resistance of the resistive oxidation structure when the resistive oxidation structure has a high resistance state and a negative voltage applied to the resistive oxidation structure is varied. The resistive oxidation structure has a high resistance of about 100 kΩ when in a high resistance state. When the negative voltage exceeds a critical (threshold) negative voltage, the resistive oxidation structure has a low resistance.

Reference numeral 24b denotes a plot illustrating changes in the resistance of the resistive oxidation structure when the resistive oxidation structure has a low resistance state and a positive voltage applied to the resistive oxidation structure is varied. The resistive oxidation structure has a resistance of about 10 kΩ in the low resistance state.

Figure 18:
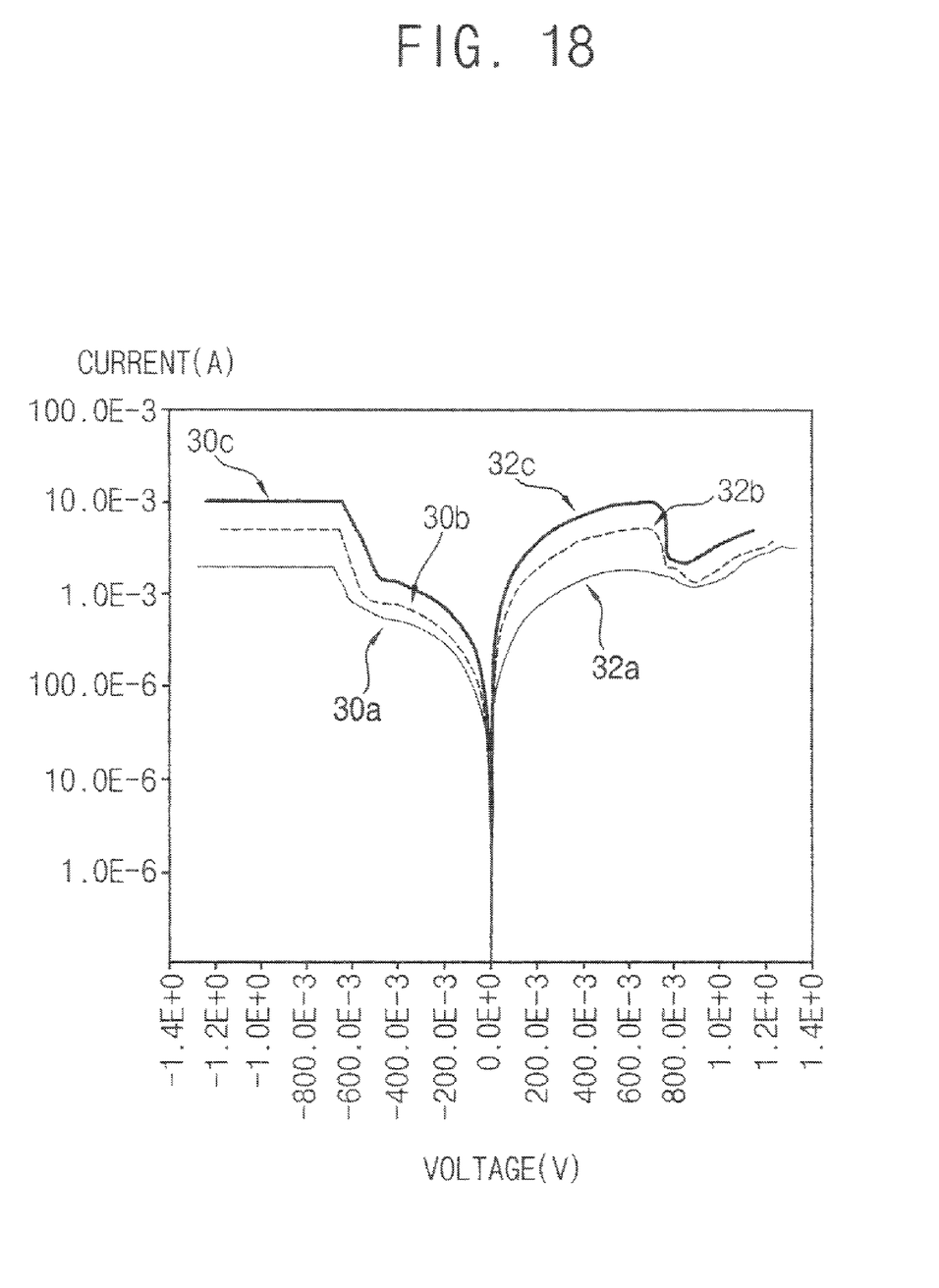
FIG. 18 is a graph illustrating electric compliance current-voltage characteristics of an RRAM device embodied in accordance with the inventive concept.

FIG. 18 is a graph illustrating electric compliance current-voltage characteristics of the Example of an RRAM unit according to the inventive concept. Specifically, FIG. 18 shows three current-voltage curves for the RRAM unit in the reset state, for different compliance currents.

Referring to FIG. 18, the current-voltage characteristics of the RRAM device of the Example in a reset state differ according to a compliance current of a set state. That is, load on the RRAM device varies depending on the programming voltage for converting the state of the RRAM unit from the set state to the reset state.

In FIG. 18, reference numeral 30a denotes a plot illustrating the relationship between current and negative applied voltage when the resistive oxidation structure has a high resistance state and the negative applied current is decreased. In this case, the set current had a compliance of about 4 mA. That is, the applied negative voltage was adjusted so that the set current did not exceed 4 mA. Accordingly, the state of the RRAM device will change from the set state to the reset state when the negative applied voltage corresponds to a set current of about 4 mA.

A reference numeral 32a denotes a plot illustrating the relationship between current and positive applied voltage when the RRAM unit is in a reset state and the set current has a compliance of about 4 mA. When the positive voltage is increased, current flowing through the resistive oxidation structure is increased.

Reference numeral 30b denotes a plot illustrating the relationship between current and negative applied voltage when the set current has a compliance current of about 7 mA and the negative applied voltage is decreased. That is, the applied voltage was adjusted so that the set current was not in excess of 7 mA. In this case, a state of the RRAM unit is changed from a set state to a reset state when the negative applied voltage corresponds to a set current of about 7 mA. Thus, the programming voltage required for changing the state of the RRAM device from a set state to a reset state is greater than that required for the case in which the set current is set to have a compliance of about 4 mA. As a result, a larger load is applied to the RRAM unit when a programming operation is carried out in a state in which the set current is set to have a compliance of about 7 mA.

A reference numeral 32b denotes a plot illustrating a relationship between current positive applied voltage when the positive voltage is decreased and the set current was set to have a compliance of about 7 mA. In this case, the values of the reset current are than those in the case in which the set current has a compliance of about 4 mA over the same range of positive applied voltages. The higher reset currents are due to larger loads.

Reference numeral 30c denotes a plot illustrating the relationship between current and negative applied voltage when the negative applied voltage is lowered and the set current was set to have a compliance of about 10 mA. That is, the negative voltage was adjusted so that the set current does not exceed 10 mA. In this case, a state of the RRAM device will change from a set state to a reset state when the negative applied voltage corresponds to a set current of about 10 mA. Thus, a greater load is applied to the RRAM than in the case in which the set current is set to have a compliance of about 4 mA or about 7 mA.

Reference numeral 32c denotes a plot illustrating the relationship between current and positive applied voltage when the oxidation resistive structure has a reset state and the set current is set to have a compliance of about 10 mA. In this case, the values of the reset current for RRAM unit are larger than the cases in which the set current is set to have a compliance of about 4 mA or about 7 mA over a range of positive applied voltages. The larger reset currents are due to larger loads.

In an RRAM unit according to the inventive concept as described above, when the compliance current is changed, the RRAM unit has a different reset current with respect to the same voltage. Thus, the RRAM device may have a multi-level switching characteristic. That is, an RRAM device according to the inventive concept may be operated like a multi-level memory cell device by adjusting the compliance current. In this way, multiple data may be stored in an RRAM unit of the device. In this case, a RRMA device embodied according to the inventive concept may possess a relatively large storage capacity.

Also, an RRAM device embodied according to the inventive concept may be employed by various electronic apparatus especially because such an RRAM device has a low reset current, may be highly integrated, may operate at a high speed and may have low power consumption.

Finally, embodiments of the inventive concept have been described herein in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiments described above but by the following claims.

What is claimed is:

1. A resistive memory unit comprising:
a first electrode;
a resistive oxidation structure having sets of oxidation layers stacked one atop the other on the first electrode, wherein the oxidation layers of each of the sets include a first metal oxidation layer and a second metal oxidation layer disposed directly on the first metal oxidation layer, the second metal oxidation layer of each of the sets is thinner than the first metal oxidation layer on which the second metal oxidation layer is disposed, and one of the first metal oxidation layers contacts an upper surface of the first electrode; and
a second electrode on the resistive oxidation structure, wherein the second metal oxidation layer of each of the sets of oxidation layers includes a layer of a metal rich oxide.

2. The resistive memory device of claim 1, wherein an upper portion of the second metal oxidation layer has an oxygen concentration larger that that of a lower potion of the second metal oxidation layer.

3. The resistive memory device of claim 1, wherein the first oxidation layer includes at least one selected from a group consisting of nickel oxide (NiO), titanium oxide (TiO), tungsten oxide (WO), tantalum oxide (TaO), aluminum oxide (AlO), zirconium oxide (ZrO), hafnium oxide (HfO), copper oxide (CuO), cobalt oxide (CoO), iron oxide (FeO), vanadium oxide (VO), yttrium oxide (YO) and lanthanide, and the second oxidation layer includes at least one selected from a group consisting of nickel oxide (NiO), titanium oxide (TiO), tungsten oxide (WO), tantalum oxide (TaO), aluminum oxide (AlO), zirconium oxide (ZrO), hafnium oxide (HfO), copper oxide (CuO), cobalt oxide (CoO), iron oxide (FeO), vanadium oxide (VO), yttrium oxide (YO) and lanthanide.

4. The resistive memory device of claim 1, wherein in each of the sets of oxidation layers, the first metal oxidation layer has a resistance higher than that of the second metal oxidation disposed thereon.

5. A resistive memory unit comprising:
a first electrode;
a resistive oxidation structure having sets of oxidation layers stacked one atop the other on the first electrode, wherein the oxidation layers of each of the sets include a first metal oxidation layer and a second metal oxidation layer disposed directly on the first metal oxidation layer, the second metal oxidation layer of each of the sets is thinner than the first metal oxidation layer on which the second metal oxidation layer is disposed, and one of the first metal oxidation layers contacts an upper surface of the first electrode; and
a second electrode on the resistive oxidation structure, wherein each of the first metal oxidation layers includes a layer of nickel oxide and each of the second metal oxidation layers includes a layer of titanium oxide.

6. The method of claim 5, wherein the layer of titanium oxide includes metal-rich titanium oxide layer.

7. A resistive memory unit comprising:

a first electrode;

a resistive oxidation structure having sets of oxidation layers stacked one atop the other on the first electrode, wherein the oxidation layers of each of the sets include a first metal oxidation layer and a second metal oxidation layer disposed directly on the first metal oxidation layer, the second metal oxidation layer of each of the sets is thinner than the first metal oxidation layer on which the second metal oxidation layer is disposed, and one of the first metal oxidation layers contacts an upper surface of the first electrode; and a second electrode on the resistive oxidation structure, wherein the resistive oxidation structure has a thickness of about 50 Å to about 250 Å, and the resistive oxidation structure has three to nine sets of the oxidation layers stacked one atop the other.

* * * * *